(12) United States Patent
Frerichs et al.

(10) Patent No.: US 6,865,727 B2
(45) Date of Patent: Mar. 8, 2005

(54) METHOD FOR CALCULATING THE CAPACITY OF A LAYOUT OF AN INTEGRATED CIRCUIT WITH THE AID OF A COMPUTER, AND APPLICATION OF THE METHOD TO INTEGRATED CIRCUIT FABRICATION

(75) Inventors: Martin Frerichs, München (DE); Achim Rein, München (DE)

(73) Assignee: Infineon Technologies AG, Munich (DE)

( * ) Notice: Subject to any disclaimer, the term of this patent is extended or adjusted under 35 U.S.C. 154(b) by 121 days.

(21) Appl. No.: 10/114,796

(22) Filed: Apr. 2, 2002

(65) Prior Publication Data

US 2002/0144224 A1 Oct. 3, 2002

(30) Foreign Application Priority Data

Apr. 2, 2001 (DE) .......................... 101 16 328

(51) Int. Cl.[7] ............................................. G06F 17/50
(52) U.S. Cl. ................................ 716/19; 716/2; 716/5; 716/11; 716/20; 716/21
(58) Field of Search ........................................ 716/1–21

(56) References Cited

U.S. PATENT DOCUMENTS

| 5,875,114 A | * | 2/1999 | Kagatani et al. ................ | 716/6 |
| 6,175,947 B1 | * | 1/2001 | Ponnapalli et al. ............ | 716/5 |
| 6,574,782 B1 | * | 6/2003 | Dewey et al. .................. | 716/5 |
| 2002/0016948 A1 | | 2/2002 | Rein | |

FOREIGN PATENT DOCUMENTS

DE     199 00 980 C1    5/2000

OTHER PUBLICATIONS

Lee et al., "Analyzing the Effects of Floating Dummy–Fills: From Feature Scale Analysis to Full–Chip RC Extraction," IEEE, Dec. 2–5, 2001, pp. 31.3.1–31.3.4.*

Park et al., "An Exhaustive Method for Characterizing the Interconnect Capacitance Considering the Floating Dumm–Fills by Employing an Efficient Field Solving Algorithm," IEEE, Sep. 6–8, 2000, pp. 98–101.*

Tian et al, "Model–Based Dummy Feature Placement for Oxide Chemical–Mechanical Polishing Manufacturability," IEEE, Jul. 2001, pp. 902–910.*

Stine, B. E. et al.: "The Physical and Electrical Effects of Metal–Fill Patterning Practices for Oxide Chemical–Mechanical Polishing Processes", IEEE, vol. 45, No. 3, Mar. 1998, pp. 665–679.

Cong, J. et al.: "Analysis and Justification of a Simple, Practical 2 1/2—D Capacitance Extraction Methodology", Design Automation Conference, 1997, pp. 627–632.

* cited by examiner

*Primary Examiner*—Vuthe Siek
(74) *Attorney, Agent, or Firm*—Laurence A. Greenberg; Werner H. Stemer; Ralph E. Locher

(57) ABSTRACT

A method for verifying a layout of an integrated circuit with the aid of a computer and the fabrication of the circuit applying the method includes the steps of inserting several floating structures, namely fill structures, in a layout wiring plane, configuring the structures into structural regions, taking the regions into consideration with respect to the wiring capacities in the vicinity of these structures for a low computational outlay, and, for each structural region (3), defining a boundary polynomial that is modeled according to the outer margins of the structural region. In the calculation of the capacity coefficient, a structural region can be taken into consideration as a whole by a large filler polygon.

9 Claims, 2 Drawing Sheets

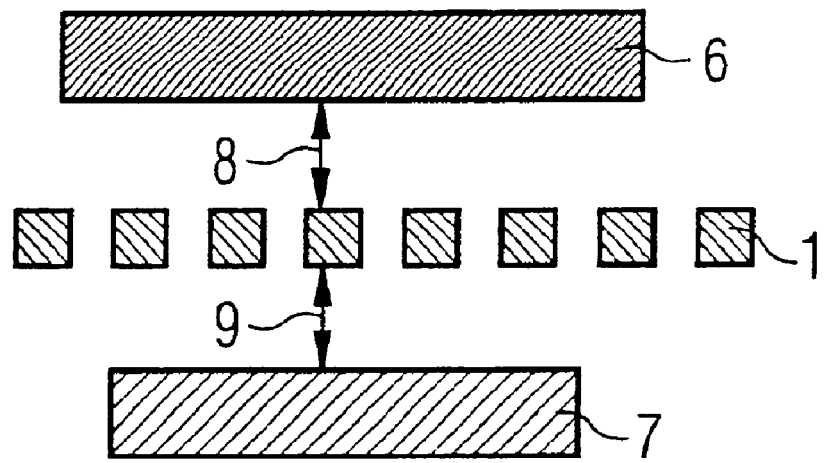
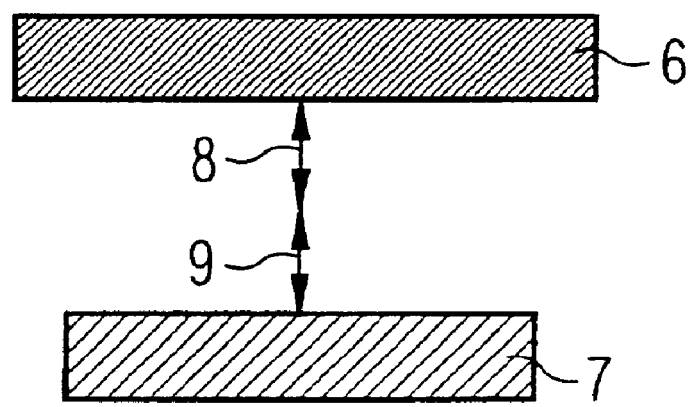

METHOD FOR CALCULATING THE CAPACITY OF A LAYOUT OF AN INTEGRATED CIRCUIT WITH THE AID OF A COMPUTER, AND APPLICATION OF THE METHOD TO INTEGRATED CIRCUIT FABRICATION

BACKGROUND OF THE INVENTION

Field of the Invention

The invention relates to a method for calculating the capacity of a layout of an integrated circuit whose wiring planes include large gaps into which what are referred to as floating structures, specifically metallic floating fillers, are inserted. The wiring capacities of the layouts are verified with the aid of a computer simulation. The invention also relates to applying the verification method to the fabrication of an integrated circuit.

In the realization of high-density integrated circuits, a specified circuit configuration is first prepared, based thereupon a layout describing the geometric shape and configuration of all components of the circuit configuration is prepared. The particular components include doped regions, insulating structures, conductive structures, metallization planes, contacts, etc. A computer typically prepares the 2-dimensional layout either as a file or a drawing. The layout is the basis for creating mask sets, which are then utilized in the technical fabrication of the integrated circuit.

Because of imprecisions, construction errors, and compromises in the creation of the layout, for instance with respect to minimum dimensions, the circuit that is fabricated according to a layout may have different characteristics than those demanded by the circuit configuration. To guarantee that the fabricated circuit functions optimally exactly according to the configuration, the layout data are repeatedly subjected to a verification process, whereupon a mask set is created from the verified, and potentially modified, layout. In the verification process, it is determined by simulation if the layout satisfies the required construction rules, i.e., whether or not it is electrically functional.

Given that the switching speed of integrated circuits is sensitively dependent on the wiring capacities occurring in the circuit, capacity calculations are performed in the verification process. These are becoming increasingly important because the parasitic wiring capacities have a tendency to increase with progressive structural miniaturization of the chips as a consequence of the inevitable decrease in the spacings, for instance, between interconnects. Thus, in the deep submicron range, the characteristics of the wiring (the interconnect) begin to dominate the overall behavior of the chip. The calculation of the capacity based upon the layout data in a more or less refined computer simulation is also referred to as capacity extraction.

For the capacity extraction, wiring networks, often referred to as networks, are observed. For instance, for a 256 Mbit memory, 380 million networks (two lines per transistor) are presumed. A wiring network is understood to be a conductive path within the high-density integrated circuit, which can branch and can extend over the entire surface of the integrated circuit. Separate wiring networks are isolated from one another.

In the capacity calculation, the capacity between these networks must be determined. For high-precision calculations in the deep submicron range, the determination can only be accomplished by programs referred to as field solvers, in which the two-dimensional or three-dimensional Laplace equation is numerically solved. The basis for determining all the subcapacities and actually calculating the capacities is the matrix of capacity coefficients, which relates to the totality of the various conductors, that is to say, the various wiring networks. Ideally, the extraction is preceded by a 3-D modeling in which a computer derives a spatial model of the wiring system from layout data and information for the fabrication process. Given the increasing proportion of irregular structures (e.g., non-planar depositions or trapezoidal interconnect cross-sections), which can no longer be handled two-dimensionally, a 3-D modeling is preferable to a layout-based extraction. On the other hand, when large layouts must be thoroughly considered, simplifications of the modeling, i.e., a layout-based extraction, with which it is possible to determine the substantive network pattern and overlaps of the wiring planes, are often the only feasible, or, in any case, the most reasonable, mode of description.

In fact, with large integrated circuits, the full 3-D capacity extraction can hardly be performed due to the immense numeric expenditure, and, in any event, techniques are needed for breaking down and simplifying the problem. German Patent DE 199 00 980 C1, corresponding to U.S. Publication No. 2002016948A1 to Rein et al., lays out an extraction method whereby the capacity for a selected wiring network relative to other networks is calculated by defining a filter polygon that corresponds to the shape of the selected wiring network but whose dimensions are larger by a prescribable degree. Next, the portions of the other laterally or vertically adjoining wiring networks that overlap the filter polygon are determined so that the capacity between these portions and the selected wiring network can be calculated. Portions located outside the filter polygon are not considered in the capacity calculation because the contribution to the capacity rapidly diminishes as the spacing between conductive structures increases. In particular, a partitioning of the filter polygon into partition cells is also proposed, which is based on what is referred to as the "scanline algorithm". The overall result is a selective and simplified 3-D extraction that is suitable for a thorough analysis of select standard networks.

For planarizing isolation layers between the wiring layers, beginning with the 0.25 $\mu$m technology of some semiconductor manufacturers, what are referred to as fill structures are inserted at locations in an IC configuration at which large gaps in the wiring planes occur, i.e., locations at which the average occupation of the wiring planes substantially deviates from a technology-specific average. What is meant by "large" or "a substantial deviation" is defined in the respective construction rules. A plurality of these metallic fill structures are automatically inserted into the configuration (layout) in a regular configuration in accordance with the construction rules afterward in a post-processing step following the creation of the physical layout (in GDS 2 format or some other format that is routinely utilized for the representation of layout data in the field of CAD). Unlike "true" interconnects, these metal structures or similar structures that are inserted for other purposes are generally not bonded; i.e., they have a non-fixed (floating) potential.

Such a configuration is problematic in the calculation of wiring capacities that are located in the vicinity (both laterally and vertically) of such floating structures, because these capacities can be precisely detected relative to floating conductors, which each of these fill structures represents, only at great expense. To accomplish such calculation, it is possible to use commercial field solvers (e.g., ODIN, from Silvaco) that permit floating boundary conditions. But these approaches are impracticable for a complete extraction of the wiring capacities of the entire layout because they far exceed manageable limits. Even a (purely) layout-based capacity extraction with the aid of commercial verification tools would explode the storage requirement of such programs and prolong their run time enormously.

Furthermore, floating fill structures have hitherto been out of the question for layout-based capacity extraction due to the immense storage requirement in the parasite extraction as well. However, this always leads to a systematic underestimation of the wiring capacities and, thus, to false predictions with respect to the signal transit times and other signal transmission effects (for instance, crosstalk predictions) on an IC. Such effects may cause yield losses in certain circumstances because the timing of clock networks, in particular, is very sensitively dependent on the wiring capacities and resistances.

SUMMARY OF THE INVENTION

It is accordingly an object of the invention to provide a method for calculating the capacity of a layout of an integrated circuit with the aid of a computer, and application of the method to integrated circuit fabrication that overcomes the hereinafore-mentioned disadvantages of the heretofore-known devices and methods of this general type and that is suitable for the fabrication of a high-density integrated circuit and allows floating structures that are inserted into the wiring also to be taken into consideration (for an acceptable computing expenditure) with respect to the wiring capacity of integrated circuits.

With the foregoing and other objects in view, there is provided, in accordance with the invention, a method for calculating the capacity of an integrated circuit layout including the steps of providing an integrated circuit layout with wiring planes and at least one wiring network, providing floating structures in at least one structural region in at least one wiring plane, the structural region having an outer margin and being separated from the wiring network in the wiring plane, defining a boundary polygon for the structural region, the boundary polygon having a shape modeled according to the outer margin of the structural region, calculating a capacity coefficient for the structural region with the floating structures based upon a filler polygon corresponding to the boundary polygon, and utilizing the capacity coefficient computed for the structural region with the floating structures for a capacity extraction of the integrated circuit layout. Preferably, the floating structures are fill structures.

To perform a verification of a layout that includes a plurality of individual floating structures, particularly fill structures, inserted into at least one wiring plane of the layout, these being disposed in the wiring plane in the form of one or more structural regions at a distance from at least one wiring network, these structures are taken into account with respect to the wiring capacities in their vertical or lateral vicinity in that a boundary polygon is defined from each structural region, the shape of which is modeled according to the outer margins of the structural region. Next, in the calculation of the capacity coefficients, the geometries of all structures of a contiguous structural region are taken into account all at once by the substitution of one large filler polygon for the individual structures, whereby the filler polygon is computer-modeled by the boundary polygon.

The invention starts before the actual capacity extraction, already considering the floating structures in the model formation for calculating the capacity coefficients that form the basis of each subsequent extraction.

The replacing of whole structural regions, which will henceforth be referred to as fill structure regions without thereby limiting their generality, by their respective boundary polygon corresponds to a geometric fusing of the fill structures into a large filler polygon, though the electrical characteristics of the overall configuration change only negligibly because the spacings of the fill structures from one another (0.7 $\mu$m for a 0.2 $\mu$m technology) are sufficiently small compared to their dimensions (1 $\mu$m). Even with such a simplified, region-by-region view of the many individual fill structures, whose regular configuration in a grid is not mandatory, it is already possible to simplify the wiring capacity problem by at least an order of magnitude.

The inventive modeling of each fill structure region in its entirety as a fused filler polygon with a plate structure makes it possible to further process the simplified data by various methods, for instance, in the context of pattern libraries or with the aid of field solvers. It also inventively opens up the possibility of a series of additional modelings, which result in exceptional simplification.

Therein, the floating filler polygon is first modeled as an isolator polygon with a high relative permittivity and equal dimensions. In the regions of a layout defined by the boundary polygon of a fill structure region, adapted capacity coefficients are calculated with the aid of a model wherein the isolator polygon is completely removed, and the standard isolator is added as the spacing between the wiring planes for which the capacity coefficients are being calculated upon reduction of its thickness by the thickness of the removed planes with the isolator polygon.

In accordance with a concomitant mode of the invention, the capacity calculated based upon the capacity extraction is compared to the circuit configuration and the layout is optimized if a discrepancy exists, and a mask set for fabricating the integrated circuit is generated based upon the optimized layout.

Other features that are considered as characteristic for the invention are set forth in the appended claims.

Although the invention is illustrated and described herein as embodied in a method for calculating the capacity of a layout of an integrated circuit with the aid of a computer, and application of the method to integrated circuit fabrication, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a diagrammatic cross-section through the layout section of FIG. 1A; and FIG. 3 is a diagrammatic cross-section of the layout section of FIG. 2 with the fill region plane removed.

DESCRIPTION OF THE PREFERRED EMBODIMENTS

Figure 1A:
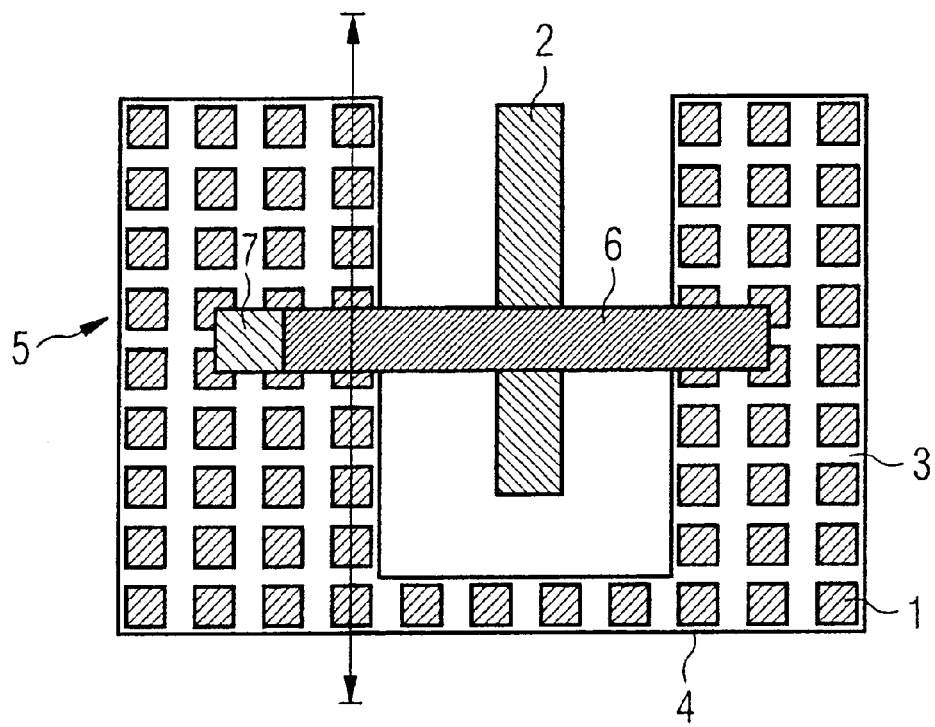
FIG. 1A is a diagrammatic plan view of a layout section with individual fill structures according to the invention.

Referring now to the figures of the drawings in detail and first, particularly to FIG. 1 thereof, there is shown an exemplarily representation of a layout section wherein a plurality of individual, regularly shaped fill structures 1 are disposed in a specified wiring plane, here the plane "metal 2." Also represented is a linear wiring network 2, which is located in the same plane, the fill region plane, and that includes a "safety spacing" relative to the fill structures 1 on all sides. The lateral safety spacing is selected large enough in the wiring configuration that lateral capacities between the wiring network 2 and the fill structures 1 can be ignored from the outset. The configuration, itself, makes possible a sufficient safety spacing without further ado because the fill structures 1 are inserted into the wiring planes specifically only in the regions of large gaps to produce planarity with the interconnect regions.

Figure 1B:
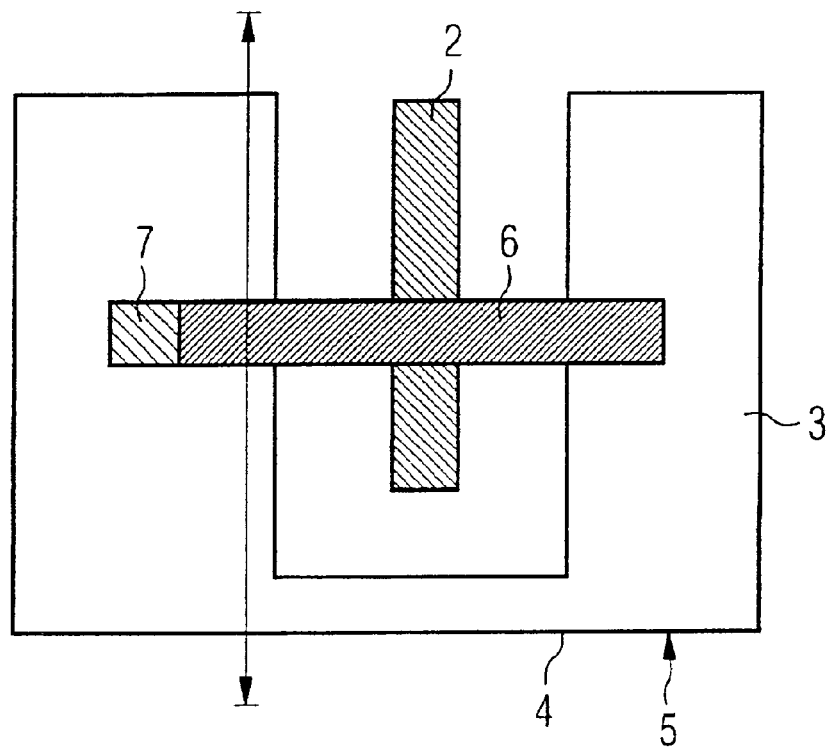
FIG. 1B is a diagrammatic plan view of a layout section with a filler polygon according to the invention.

Like the wiring networks mentioned below, the wiring network 1 is a contiguous structure composed of conductive elements such as doped semiconductor regions, doped polycrystalline semiconductor layers, metal layers, and the like, which can touch one another, overlap, and extend into various planes. The fill structures 1 form a contiguous fill structure region 3. The boundary polygon 4 is allocated to the fill structure region 3. FIG. 1B lacks the individual fill structures 1, so that it is clear that the filler polygon 5 as a whole is best imagined as a plate-type structure in the respective plane.

FIG. 1 also represents two additional linear wiring networks 6 and 7 that respectively extend in a plane above and below the fill region plane. For the sake of comprehensibility, the left-hand region of the bottom wiring network 7 is visible (gray).

The wiring networks 6 and 7 partially overlap, whereby the fill structures 1 are situated between them in the left-hand region of the fill structure region 3. The present invention is particularly important at these locations, because a local capacity calculation geared toward the individual fill structure would actually be needed. But a large number of elements and nodes would have to be inputted into the network list as data and processed for such a purpose. However, substantial simplification is achieved by taking into account, region-by-region, approximately 1,000 fill structures 1 through a single filler polygon 5, for example. Usually, several filler polygons, which are not represented in the layout section according to FIG. 1, have to be taken into account in one plane. Otherwise an individual, especially large fill structure 1 can, of course, be treated as a separate fill structure region 3.

FIG. 1 represents the simple instance in which, as the modeling of boundary polygon 4, its direct correspondence with the outer boundaries of the fill structure region 3 is selected. Likewise, the filler polygon 5 corresponds directly to the boundary polygon 4. However, in one or both modeling operations the model may be less faithfully rendered. The object of the modelings is typically to simplify the relevant shape, namely to "smooth" an overly "jagged" fill structure region 3.

FIG. 2 represents a cross-section with the top wiring network 6 (plane metal 3), the bottom wiring network 7 (plane metal 1) and the intervening fill region plane with the individual fill structures 1. Arrows indicate the respective spacing of the top and bottom planes relative to the fill region plane. Between the planes are isolation layers 8 and 9, henceforth referred to as a standard isolator, the thickness of which corresponds to the aforementioned spacings.

Such a configuration can now be modeled as a series circuit of three vertically configured plate capacitors, whereby imaginary, non-illustrated capacitor plates can be pictured at the boundary surfaces of the dielectric. The topmost plate capacitor is formed from the top wiring network 6, the top isolation layer 8 as a dielectric, and a bottom imaginary capacitor plate. The middle plate capacitor is formed by a top imaginary capacitor plate, the floating filler polygon 5 as a dielectric, and a bottom imaginary capacitor plate. The bottom plate capacitor is formed by an imaginary capacitor plate, the bottom isolation layer 9, and the bottom wiring network 7.

According to such a "series circuit" model, a three-step procedure can be inventively executed.

First, as described in connection with FIG. 1, rather than individually, the geometries of all fill structures as a whole are taken into account by the boundary polygons 4 of the fill structure regions 3.

Second, floating conductors can be calculated in a conventional fashion in that they are modeled as an isolator with a high relative permittivity ($\epsilon_r > 1000$), equal height and dimensions. Such a configuration produces results nearly identical to the exact results of a corresponding 3-D field solver in which the floating conductor was simultaneously modeled. Thus, the filler polygon 5 can be viewed as an isolator polygon, or as the dielectric of the middle plate capacitor according to FIG. 2.

The process makes possible, as the third step, the performing of the capacity extraction on the original configuration by a standard verification tool, substantially without having to sacrifice accuracy. To accomplish this, correspondingly adapted capacity coefficients are utilized for the capacity extraction in the regions of the layout defined by the boundary polygons of the fill structures. The adapted coefficients are computed with the aid of the "series circuit" model, in which the isolator polygon is completely removed, and the standard isolator is added on as the total spacing between the wiring planes for which the coefficients are calculated, the thickness of such an isolator having been reduced by the thickness of the removed plane with the fill structures, i.e., the isolator polygon.

The "removal" of the fill region plane clearly boils down to the fill region plane being implicitly taken into account by way of the plane spacing, which has been reduced by modeling (cf. FIG. 3), and is now defined only by the sum of the original spacings of the top and bottom planes relative to the fill region plane.

Specifically, the conventional formula is applied whereby the reciprocal value of the total capacity of a series circuit of capacitors equals the sum of the reciprocals of the individual capacitors. Because the capacity of the middle plate capacitor of FIG. 2 tends to infinity according to the modeling of the floating filler polygon as isolator, its reciprocal value tends to zero, so that the contribution of the middle capacitor, i.e., the fill region plane, drops out of the formula for the total capacity.

Besides such calculable fill structure zones 3, the "normal" (i.e., without fill structures), standard capacity coefficients are utilized. The standard extraction tools permit an efficient differentiation among the various regions. Accordingly, in the algorithm, the requisite accounting for a plurality of floating fill structures is substantially reduced simply to distinguishing if the local capacity for a region must be computed with or without fill structure regions 3.

For construction specifications necessitating the calculation of lateral capacities with respect to floating fill structures, a series circuit of three laterally disposed plate capacitors can be considered in analogous fashion.

Accordingly, instead of the precise consideration of the geometry of many individual floating fill structures, it is advantageously possible according to the invention to utilize an all-in-one modeling of these structures (namely the boundary of the fill structure regions) to be able to derive corresponding capacity coefficients therefrom for a layout-based extraction. A layout without the fill structures can be computationally utilized in that only the boundary of the fill structure regions must be present as the additional plane. In addition, only a slight imprecision relative to the exact computation by 3-D field solvers must be accepted as the cost of the described 3-step method.

Hitherto the "normal" capacity coefficients have been calculated in PRECICE, a special preprogram for calculating capacity coefficients for commercial layout-based extraction tools such as VAMPIRE or DIVA. Such a program can now be expanded accordingly to be able to compute the modeling of the fill structures as well as the resulting modified capacity coefficients. Such occurs in the following steps.

First, the planes in which the boundary polygons 4 of the fill structure regions 3 are stored are prescribed in PRE-CICE.

These boundary polygons 4 then lie in a defined (virtually or physically) plane of the layout as a separate result of the post-processing. The data of the fill structures 1 is itself filed in an additional plane (or potentially filed in the same plane but provided with a special marker).

Then the modified capacity coefficients are calculated from the modeling of the fill structures as isolators with a high relative permittivity with the subsequent utilization of reduced plane spacings in case the two wiring planes between which the capacity coefficients are calculated are more than one plane apart (e.g., poly and metal 2, or poly and metal 3, but not metal 1 and metal 2). The combinations occurring according to the combinatory system should be considered.

The modified capacity coefficients can then be outputted, for instance, in the run-set syntax of VAMPIRE of DIVA, with a corresponding mask (plane) for the boundary polygons 4 of the fill structures 1 in the respective wiring plane. This results in command chains such as:

Cap_mod (metal1, metal3)=cap (metal ANDNOT (boundary_fill) metal3)

Clearly, the critical decision of whether or not there is a fill structure region 3 at the relevant location is made here.

The inventively gained data, i.e., capacity coefficients, can also be processed by other extraction methods, for instance, they can be utilized to accelerate a 3-D extraction tool, in a pattern library, or in the context of stochastic methods.

To fabricate an integrated circuit, a layout including wiring networks 2, 6, and 7 and floating fill structures 1 is prepared by computer from a circuit configuration. In at least one wiring plane of the layout, a plurality of individual floating fill structures 1 are inserted that are disposed in the wiring plane in the form of one or more fill structure regions 3 that are separated from at least one wiring network 2.

As described above, the fill structures 1 are taken into account with respect to the wiring capacities in their vertical or lateral vicinity in that a boundary polygon 4 is defined for each fill structure region 3, whose shape is modeled according to the outer margins of the fill structure region 3, and, in the calculation of the capacity coefficients, the geometries of all fill structures 1 of a contiguous fill structure region 3 are considered all at once by the substitution of a large filler polygon 5 for the individual fill structures 1, whereby the filler polygon 5 is computer modeled by the boundary polygon 4.

The calculated capacity is then compared to the circuit configuration, whereby the layout is optimized given a discrepancy. Several iterations may be required.

Finally, a mask set is produced based upon the verified layout, which is utilized for fabricating the integrated circuit. Details of such a procedure, i.e., the program sequence, can be configured analogously to the method that is described from the above cited German Patent DE 199 00 980 C1.

We claim:

1. A method for calculating the capacity of an integrated circuit layout, which comprises:

providing an integrated circuit layout with wiring planes and at least one wiring network;

providing floating structures in at least one structural region in at least one wiring plane, the structural region having an outer margin and being separated from the wiring network in the wiring plane;

defining a boundary polygon for the structural region, the boundary polygon having a shape modeled according to the outer margin of the structural region;

calculating a capacity coefficient for the structural region with the floating structures based upon a filler polygon corresponding to the boundary polygon; and utilizing the capacity coefficient computed for the structural region with the floating structures for a capacity extraction of the integrated circuit layout.

2. The method for fabricating an integrated circuit with the method according to claim 1, which further comprises:

comparing the capacity calculated based upon the capacity extraction to the circuit configuration and optimizing the layout if a discrepancy exists; and generating a mask set for fabricating the integrated circuit based upon the optimized layout.

3. The method according to claim 1, wherein the floating structures are fill structures.

4. A method for calculating the capacity of an integrated circuit layout, which comprises:

providing an integrated circuit layout with wiring planes and at least one wiring network;

providing floating structures in at least one structural region in at least one wiring plane, the structural region having an outer margin and being separated from the wiring network in the wiring plane;

defining a boundary polygon for the structural region, the boundary polygon having a shape modeled according to the outer margin of the structural region;

calculating a capacity coefficient for the structural region with the floating structures based upon a filler polygon corresponding to the boundary polygon;

modeling the filler polygon with an isolator polygon having a high relative permittivity and equal dimensions;

calculating the capacity coefficient for the structural region with the floating structures with a model in which the isolator polygon is completely removed to add a standard isolator, having a thickness reduced by a thickness of the isolator polygon, in a region of the structural region as the capacity coefficient of two wiring planes between which is disposed the wiring plane with the floating structures; and utilizing the capacity coefficient computed for the structural region with the floating structures for a capacity extraction of the integrated circuit layout.

5. The method for fabricating an integrated circuit with the method according to claim 4, which further comprises:

comparing the capacity calculated based upon the capacity extraction to the circuit configuration and optimizing the layout if a discrepancy exists; and generating a mask set for fabricating the integrated circuit based upon the optimized layout.

6. A method for fabricating an integrated circuit, which comprises:

providing an integrated circuit layout with wiring planes and at least one wiring network;

providing floating structures in at least one structural region in at least one wiring plane, the structural region having an outer margin and being separated from the wiring network in the wiring plane;

defining a boundary polygon for the structural region, the boundary polygon having a shape modeled according to the outer margin of the structural region;

calculating a capacity coefficient for the structural region with the floating structures based upon a filler polygon corresponding to the boundary polygon;

utilizing the capacity coefficient computed for the structural region with the floating structures for a capacity extraction of the integrated circuit layout;

comparing the capacity calculated based upon the capacity extraction to the circuit configuration and optimizing the layout if a discrepancy exists; and generating a mask set for fabricating the integrated circuit based upon the optimized layout.

7. The method according to claim 6, wherein the floating structures are fill structures.

8. A method for fabricating an integrated circuit, which comprises:

providing an integrated circuit layout with wiring planes and at least one wiring network;

providing floating structures in at least one structural region in at least one wiring plane, the structural region having an outer margin and being separated from the wiring network in the wiring plane;

defining a boundary polygon for the structural region, the boundary polygon having a shape modeled according to the outer margin of the structural region;

calculating a capacity coefficient for the structural region with the floating structures based upon a filler polygon corresponding to the boundary polygon and modeling the filler polygon with an isolator polygon having a high relative permittivity and equal dimensions;

calculating the capacity coefficient for the structural region with the floating structures with a model in which the isolator polygon is completely removed to add a standard isolator, having a thickness reduced by a thickness of the isolator polygon, in a region of the structural region as the capacity coefficient of two wiring planes between which is disposed the wiring plane with the floating structures;

utilizing the capacity coefficient computed for the structural region with the floating structures for a capacity extraction of the integrated circuit layout;

comparing the capacity calculated based upon the capacity extraction to the circuit configuration and optimizing the layout if a discrepancy exists; and generating a mask set for fabricating the integrated circuit based upon the optimized layout.

9. The method according to claim 8, wherein the floating structures are fill structures.

* * * * *